United States Patent [19]

Uribe

[11] Patent Number: 5,152,007

[45] Date of Patent: Sep. 29, 1992

[54] METHOD AND APPARATUS FOR DETECTING SPEECH

[75] Inventor: Juan R. Uribe, Brookfield, Ill.

[73] Assignee: Motorola, Inc., Schaumburg, Ill.

[21] Appl. No.: 690,033

[22] Filed: Apr. 23, 1991

[51] Int. Cl.$^5$ .................... H01Q 11/12; H04M 11/04
[52] U.S. Cl. ........................................ 455/116; 381/47
[58] Field of Search ................. 455/116, 79, 78; 381/42, 46, 41, 47

[56] References Cited

U.S. PATENT DOCUMENTS

| | | |
|---|---|---|
| 3,962,553 | 6/1976 | Linder .................................. 455/36 |
| 4,378,603 | 3/1983 | Eastmond . |
| 4,628,529 | 12/1986 | Borth et al. . |
| 4,811,404 | 3/1989 | Vilmur et al. . |
| 4,905,288 | 2/1990 | Gerson et al. . |
| 4,959,865 | 9/1990 | Stettiner et al. . |

OTHER PUBLICATIONS

*An Algorithm for Determining the Endpoints of Isolated Utterances*, L. R. Rabiner and M. R. Sambur. The Bell System Technical Journal vol. 54, No. 2, Feb. 1975. This article refers to the use of zero crossing rate and average amplitude in detecting speech data from background noise.

*Primary Examiner*—Reinhard J. Eisenzopf
*Assistant Examiner*—Christine K. Belzer
*Attorney, Agent, or Firm*—Kirk W. Dailey; Robert H. Kelly

[57] ABSTRACT

A method of generating a first signal (115) in a radiotelephone (101) representing the detection of speech on a second signal having background noise, a magnitude, a zero crossing rate and divided in time by frames having a predetermined time period. In absence of speech, the method characterizes the background noise (209) and computes background noise thresholds (211). The method computes an average of the magnitude of the second signal and a zero crossing rate of the second signal for a given frame (215). Then, compares said average of the magnitude (217) and said zero crossing rate (221) of the second signal to said background noise threshold. Upon one of said average of the magnitude and said zero crossing rate consecutively exceeding said background noise thresholds for a first predetermined number of frames, the transceiver(107) is turned on.

7 Claims, 4 Drawing Sheets

METHOD AND APPARATUS FOR DETECTING SPEECH

FIELD OF THE INVENTION

This invention generally relates to speech detection and more specifically to speech detection for use in controlling a transmitter.

BACKGROUND OF THE INVENTION

Generally, speech detection techniques are used to differentiate between background noise and speech. Speech can be divided into two main categories referred to as voiced speech and unvoiced speech. Voiced speech includes vowels and other phonemes, these are harsh tones and they generate a quasi-periodic signal with a relatively high magnitude when compared to unvoiced speech. Unvoiced speech includes "S's" and soft components of speech, the speech generally contains high frequency non-periodic signals with a lower magnitude as compared to voiced speech. There are two basic types of algorithms used to detect between the background noise and speech. The first type simply use the magnitude or magnitude of the signal to decide the type of data on the signal. The second type is more complicated, this type of algorithm filters the signal into several different frequency ranges and then compare magnitudes of the signals to decide if speech is contained in the signal.

The first technique uses only the magnitude of the signal and compares it against a predetermined threshold created for the background noise. This technique is extremely simple and it is widely used in applications including radiotelephones. After the background noise has been characterized, the magnitude of each section of signal thereafter is compared to the background noise threshold. If the magnitude of the section exceeds the background noise threshold, then the signal is said to contain speech. The problem with this simple method is that it is not accurate when analyzing unvoiced speech. Unvoiced speech contains relatively low energy signals, subsequentially, some of the unvoiced speech is characterized as background noise.

A second method of speech detection, as detailed in U.S. Pat. No. 4,811,404, is far more complex than the first method. Here, the incoming signal being analyzed is divided into several frequency ranges using bandpass filters or the like. Then, each frequency range is analyzed for the magnitude of the signal in that range and compared with the background noise characterization. This technique is far more accurate than the first method because it can differentiate between high frequency, low magnitude, unvoiced speech and lower frequency, low magnitude, background noise. Thus, this additional differentiation allows for a more accurate detection of speech in a signal containing background noise. However, the relatively large amount of hardware and software necessary to analyze these signals limits its application.

In radiotelephones today, there is tremendous pressure to increase battery life and reduce the size and weight of the radiotelephone. One method of reducing the power consumption of the radiotelephone is to turn-off the transmitter when there are pauses in the speech. However, this power savings must not be consumed by the technique used to shut-down the transmitter during pauses in the speech. The technique must also be able to turn on the transmitter before the signal containing the speech is ignored. Therefore, a need exists for an accurate speech detection method which is computationally simple, can be completed in real time, has small physical size and does not consume a large amount of power.

SUMMARY OF THE INVENTION

The present invention encompasses a method of generating a first signal representing the detection of speech on a second signal having background noise, a magnitude, a zero crossing rate and is divided in time by frames having a predetermined time period. In absence of speech, the method characterizes the background noise and computes background noise thresholds.

The method computes an average of the magnitude of the second signal and a zero crossing rate of the second signal for a first frame. Then, compares said average of the magnitude and said zero crossing rate of the second signal to said background noise threshold. Upon one of said average of the magnitude and said zero crossing rate consecutively exceeding said background noise thresholds for a first predetermined number of frames, the second signal is turned on.

DETAILED DESCRIPTION OF A PREFERRED EMBODIMENT

Figure 1:
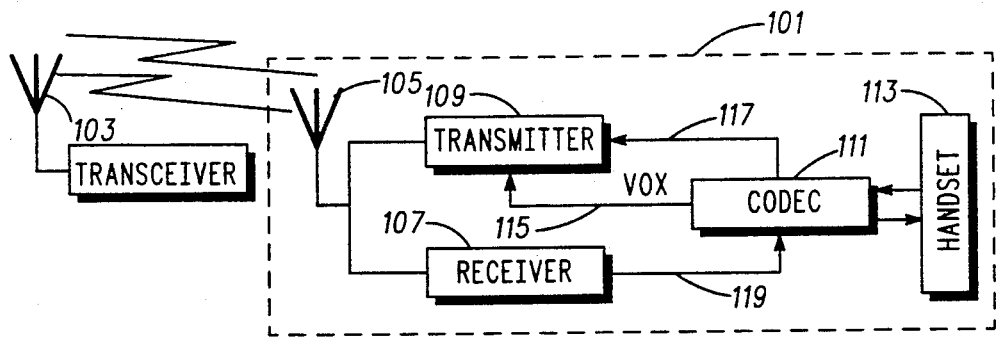
FIG. 1 is a block diagram of a radiotelephone system including a fixed site transceiver and a portable or mobile radiotelephone which may employ the present invention.

FIG. 1 is a block diagram of a radio frequency transmission system including the fixed site transceiver 103 which services a fixed coverage area including the radiotelephone 101. The fixed site transceiver 103 sends and receives radio frequency (RF) signals from the radiotelephone 101, the RF signals include speech and/or data signals. In the preferred embodiment, the RF signals include digitally encoded data in a time division multiple access (TDMA) system. The antenna 105 couples the RF signals received from the fixed site transceiver 103 converting them into electrical radio frequency signals which are then received by the receiver 107 and converted into a proper data format for interpretation by other parts of the radiotelephone 101. The receiver 107 outputs digital data signals on the signal line 119 to be interpreted and converted to analog signals by the CODEC 111 for use by the handset 113. The handset 113 includes means for transmitting speech and means for receiving speech by the user. During a phone call, as the user speaks into the handset 113, the user's speech is converted into analog electrical signals and transferred to the CODEC 111. The CODEC 111 receives the analog speech channel signals from the handset 113 and converts them to the appropriate digital signals and transmits them over the signal lines 117 to the transmitter 109. Simultaneously, the CODEC analyzes each frame of digital data which will be transmitted back to the fixed site transceiver 103 and determines which frames contain speech. The result of this analysis is used to create the VOX control signal 115 to control the transmitter 109. The VOX signal 115 turns on and off the transmitter 109 depending on if the data signals being sent to the transmitter 109 via the signal line 117 contain speech data. The VOX signal 115 allows the transmitter 109 to be turned off at times when only background noise is present, thus, it reduces the power consumption of the radiotelephone 101 and extends the battery life.

Figure 2A:
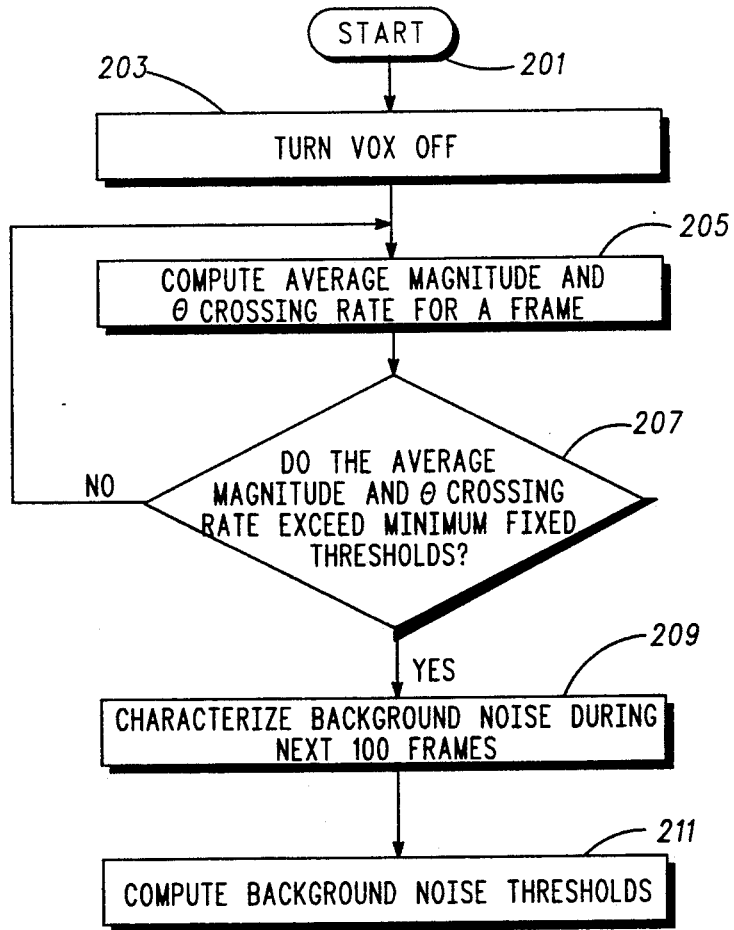
FIGS. 2A-2C are a process flow chart of a method of speech detection which may employ the present invention.
Figure 2B:
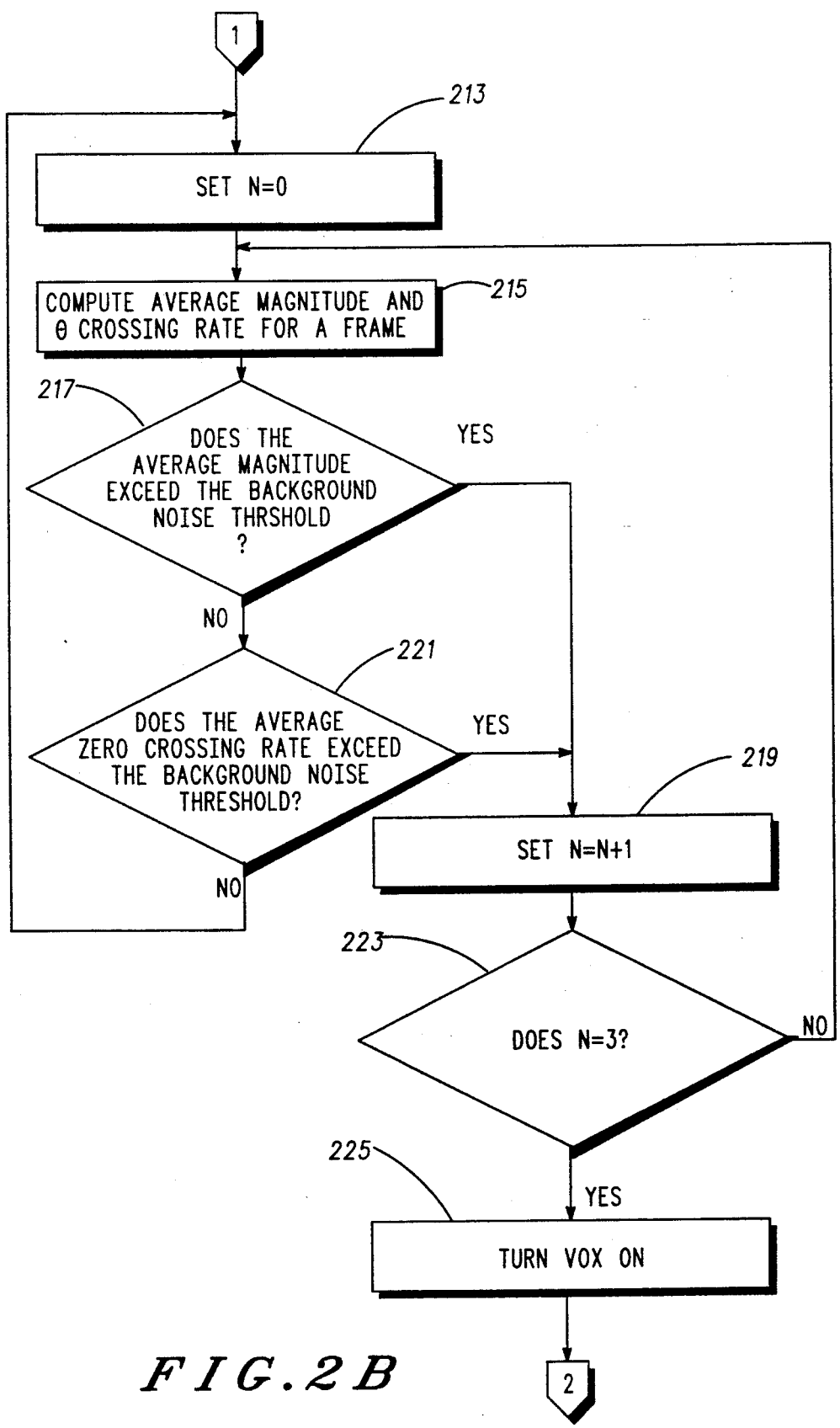
Figure 2C:
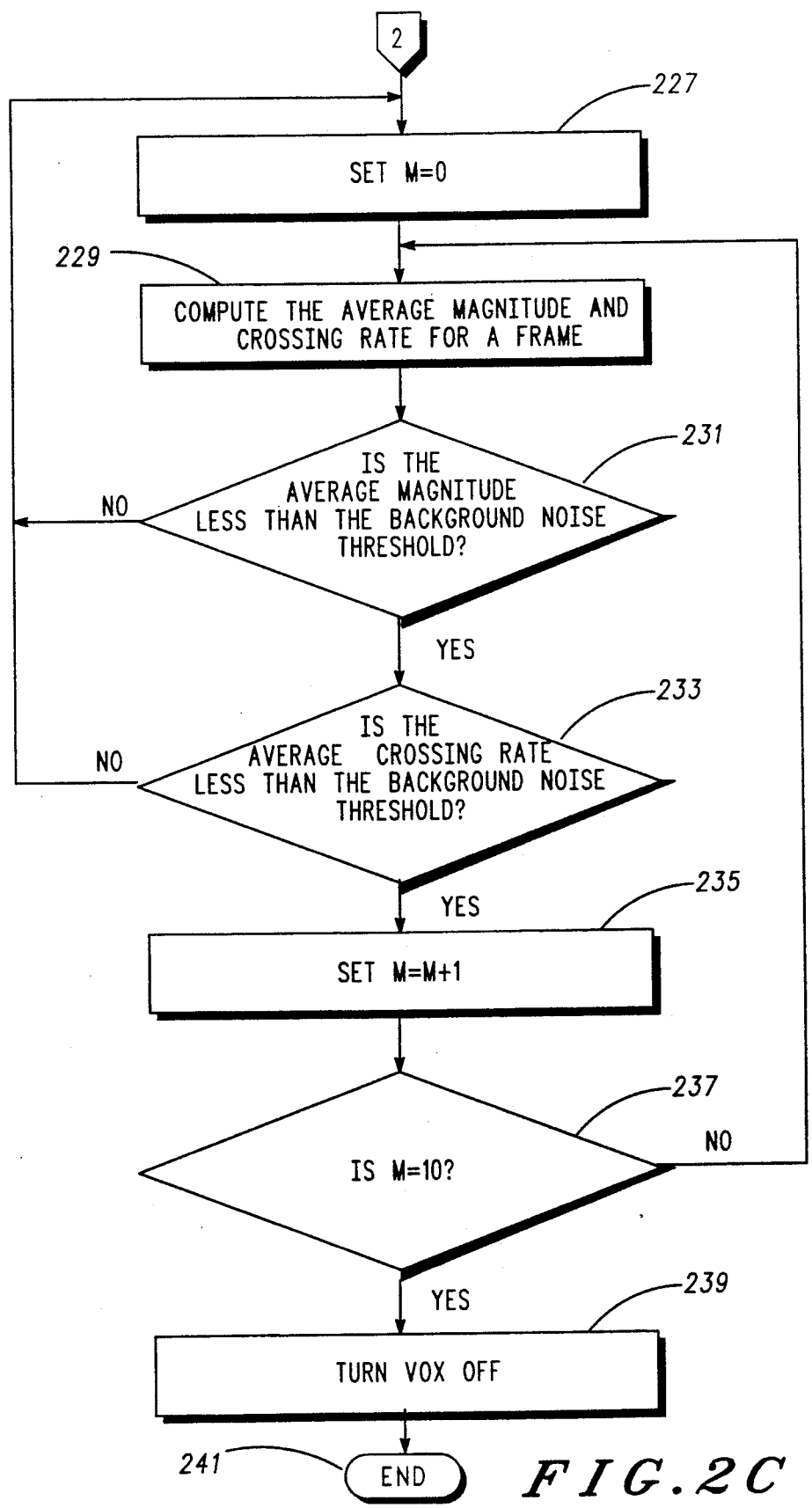

FIG. 2 is a process flow chart of the method used in the preferred embodiment to detect speech transmissions on the speech channel signal and to create the VOX signal 115 which turns-off the transmitter 109 when the speech channel signal does not contain any speech. In the preferred embodiment, the method is contained within the CODEC. The CODEC is implemented in a Digital Signal Processor such as the DSP 56000 currently available from Motorola, Inc.

The process starts at 201. In the preferred embodiment, the process starts at the initiation of a phone call, however, this process can also be started at any point in time where the speech channel signal is guaranteed not to contain speech. At 203, the VOX signal 115 is turned off, thus, shutting off the transmitter 109 until a later point in time when speech is detected on the speech channel signal.

The speech channel signal input into the CODEC from the handset 113 is digitized and divided into frames, each frame containing 20 milliseconds of data. The speech channel signal is sampled at a rate of 8000 samples per second, thus, each frame contains 160 samples. At 205, the average magnitude and the zero crossing rate for a frame is computed. The average magnitude is defined by summing the absolute values of each sample and dividing by 160. The speech channel signal varies in magnitude between ±0.775 V, when the signal is sampled it is given a sign and a magnitude. The zero crossing rate is determined by looking at each consecutive pair of samples in a given frame and looking for a change in the sign. The results are summed for each frame. The zero crossing rate is directly correlated to the frequency contents of the signal for that given frame.

At 207, the average magnitude and zero crossing rate determined in 205 are compared against the minimum fixed thresholds determined when there is no microphone or handset attached to the CODEC 111 to determine if the handset is connected. If the handset 113 is not connected, the process in FIG. 2 returns to 205 which again computes the average magnitude and zero crossing rate of a frame. Upon the magnitude and/or the zero crossing rate exceeding the minimum fixed thresholds process advances to 209.

At 209, there is sufficient time in which there will be no speech on the radiotelephone 101. Here, the background noise is characterized. In the preferred embodiment, 100 frames are used to characterize the background noise, this may be adjusted depending on the needs of the user. The characterization of the background noise becomes more accurate as the number of frames is increased. The characterization of the background includes determining the mean value of the average magnitude and the mean value of the zero crossing rate of the speech channel signal over the predetermined number of frames. Simultaneously, the standard deviation for the mean value of the average magnitude and the zero crossing rate are computed. At 211, the background noise thresholds are computed which are used to compare a current frame against to determine if there is speech within the speech channel signal.

The computation of the magnitude threshold is equal to the mean value of the average magnitude computed over the preceding 100 frames plus the standard deviation of the average magnitude multiplied by a weighting variable. In the preferred embodiment, the weighting variable is set to 8. Assuming a Gaussian distribution of the background noise, multiplying the standard deviation by 8 allows a high degree of certainty that the signal's magnitude which exceeds the magnitude threshold will contain speech data. This weighing variable may be changed according to the needs of the application. Reducing the variable increases the chance of transmitting background noise to the fixed site transceiver 103 and increasing the variable increases the chance of ignoring speech data. The zero crossing rate threshold is determined in a similar manner, it is the average zero crossing rate determined by the previous 100 frames, plus the standard deviation of the zero crossing rate multiplied by the weighting variable. Again, for the preferred embodiment, the weighting variable is set to 8, however, this variable may be adapted to the application which is necessary for the user and it does not need to be equal to the weighting variable used for the average magnitude threshold. After completing 211, the initialization of the process is completed, the background noise is characterized, the transmitter 109 is turned off. The process is ready to detect speech on the speech channel signal, turn on and off the transmitter 109 in real time to avoid transmitting background noise to the transceiver 103.

At 213, the variable N is set to zero. The variable N is used to indicate the number of consecutive frames which exceed the background noise thresholds. In order to eliminate short bursts of extraneous noise from turning on the transmitter 109, the preferred embodiment requires three consecutive frames which exceed the threshold before the transmitter 109 is turned on. Detecting three consecutive frames exceeding the background threshold indicates that speech is present. This value is variable and may be adjusted according to the specific application. At 215, the average magnitude and the zero crossing rate for a frame is computed. At 217, this computed average magnitude is compared against the background noise magnitude threshold. If the background noise threshold is not exceeded, then the average zero crossing rate computed previously is compared to the background noise zero crossing rate threshold at 221. If neither the average magnitude nor the zero crossing rate exceed the background noise thresholds then the process returns to 213 and waits until a frame exceeds the thresholds. Upon detection of either the average magnitude or the zero crossing rate exceeding the background noise threshold for a given frame, the variable N is incremented by 1 at 219. At 223 the variable N is compared to 3, because 3 is the number set in the preferred to determine that true speech and not extraneous noise is apparent on the speech channel signal. If the variable N does not exceed 3, then the algorithm returns to 215 where a new frame is analyzed for its content of speech data. Upon three consecutive frames each exceeding the background noise thresholds, the transmitter 109 is turned on with the VOX signal at 225. The VOX signal is also referred to as the first signal. Once the transmitter 109 has been turned on, the algorithm now attempts to detect the absence of speech data and turn off the transmitter 109 to avoid transmission of background noise to the fixed site transceiver 103.

At 227, the variable M is set to zero. This variable M is analogous to the variable N except for this variable is a safeguard against non-transmission of speech. The algorithm in the preferred embodiment must detect 10 consecutive frames that have the average magnitude and the zero crossing rate below the background noise threshold, insuring that speech data is not unnecessarily eliminated from transmission. At 229, the average magnitude and the zero crossing rate for a given frame is computed. At 231, the average magnitude is compared to the background noise thresholds. If the threshold is exceeded the algorithm returns to 227 and resets the variable M to zero. When the average magnitude is less than the background noise threshold then the average crossing rate is compared to the background noise threshold at 233. If the threshold is exceeded, the algorithm returns to 227 and sets the variable to zero. When the average crossing rate does not exceed the background noise threshold, the variable M is incremented by 1 at 235. At 237, the variable M is compared to 10. If the variable M does not exceed or is equal to 10, then the algorithm returns to 229 where the average magnitude and the zero crossing rate for the next frame is computed. At 239, Upon 10 consecutive frames in which both the magnitude and the zero crossing rate do not exceed the background noise threshold, the algorithm assumes that there is no speech present on the speech channel signal and turns off the VOX signal 115 which shuts-down the transmitter 109. The algorithm ends at 241.

Figure 3:
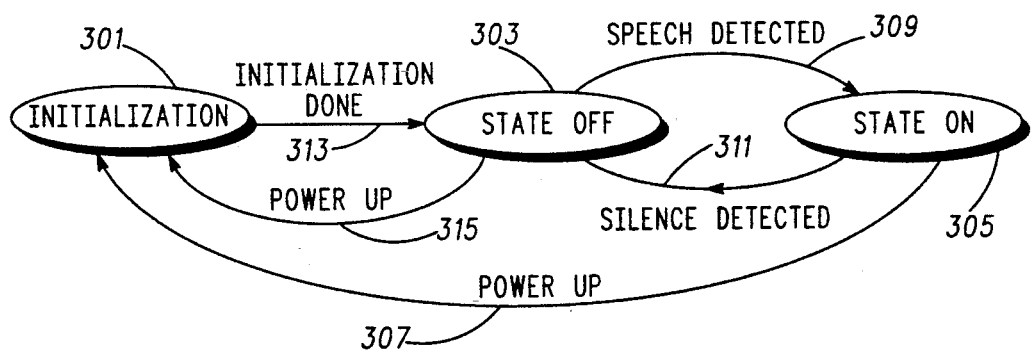
FIG. 3 is a state diagram of the transmitter which may employ the present invention.

FIG. 3 is a state diagram of the preferred embodiment. 301 is the initialization state. Here, the algorithm detects that a handset is present, the transmitter 109 is turned off and the background noise is characterized. Upon completion of this initialization process at 313, the transmitter 109 transfers from the initialization state 301 to an off state at 303. Upon a detection of speech at 309, as described in the method of FIG. 2, the transmitter 109 transfers to the on state 305. At 311, upon detection of only background noise or silence, the transmitter 109 transitions back to the off state 303. Upon power-up or the beginning of a phone call, the transmitter 109 transitions to the initialization state 301.

In the preferred embodiment the magnitude and the zero crossing rate of the speech channel signal are used to determine whether speech is present. The speech channel signal is also referred to as the second signal. In the future, other criteria may be implemented such as pattern detection and reflection coefficients of the frames such as those determined by the Vector Sum Excited Linear Prediction algorithm (VSELP), however, future implementations are not limited to these characteristics as there may be other ways to characterize speech patterns.

What is claimed is:

1. A method of generating a first signal representing the detection of speech on a second signal having background noise, a magnitude, a zero crossing rate and is divided in time by frames having a predetermined time period, the method comprising the steps of:
   characterizing, in absence of speech, the background noise of the second signal comprising the steps of:
      computing an average of the magnitude of the second signal for a second predetermined number of frames, and
      computing an average of the zero crossing rate of the second signal for said second predetermined number of frames;
   computing background noise magnitude and zero crossing rate thresholds for the second signal;
   computing an average of the magnitude of the second signal for a first frame;
   computing a zero crossing rate of the second signal for said first frame;
   comparing said average of the magnitude of the second signal to said background noise magnitude threshold;
   comparing said zero crossing rate of the second signal to said background noise zero crossing rate threshold; and
   generating, upon said average of the magnitude or said zero crossing rate consecutively exceeding said background noise threshold a first predetermined number of frames, the first signal.

2. A method of generating a first signal in accordance with claim 1 wherein said computing said background noise magnitude and zero crossing rate thresholds further comprises the steps of:
   computing a standard deviation of the magnitude of the second signal for said second predetermined number of frames;
   computing a standard deviation of the zero crossing rate of the second signal for said second predetermined number of frames;
   multiplying said standard deviation of the magnitude by a second predetermined number and adding said average of the magnitude; and
   multiplying said standard deviation of the zero crossing rate by a third predetermined number and adding said average of the zero crossing rate.

3. A method of generating a first signal in accordance with claim 1 wherein said second signal is a speech channel signal.

4. A radiotelephone including a power saving apparatus, a transmitter, and a handset, the handset generating a second signal responding to a user's speech, having a magnitude, a zero crossing rate, background noise and is divided in time by frames having a predetermined time period, the apparatus comprising:
   means for converting the second signal to a digital representation;
   means for detecting the user's speech in said digital representation of the second signal comprising:
      means for characterizing, in absence of the user's speech, the background noise of the second signal, comprising:
         computing an average of the magnitude of the second signal for a second predetermined number of frames, and
         computing an average of the zero crossing rate of the second signal for said second predetermined number of frames,
      means for computing background noise magnitude and zero crossing rate thresholds for the second signal,
      means for computing an average of the magnitude of the second signal for a first frame,
      means for computing a zero crossing rate of the second signal for said first frame,
      means for comparing said average of the magnitude of the second signal to said background noise magnitude threshold,
      means for comparing said zero crossing rate of the second signal to said background noise zero crossing rate threshold, and means for generating, upon said average of the magnitude or said zero crossing rate consecutively exceeding said background noise threshold a first predetermined number of frames, a first signal, indicating detection of the user's speech on the second signal; and means, responsive to detection of the user's speech, for turning on the transmitter.

5. An apparatus for generating a first signal representing the detection of speech on a second signal having background noise, a magnitude, a zero crossing rate and is divided in time by frames having a predetermined time period, the apparatus comprising:

means for characterizing, in absence of speech, the background noise of the second signal comprising:
  means for computing an average of the magnitude of the second signal for a second predetermined number of frames, and
  means for computing an average of the zero crossing rate of the second signal for said second predetermined number of frames;

means for computing background noise magnitude and zero crossing rate thresholds for the second signal;

means for computing an average of the magnitude of the second signal for a first frame;

means for computing an average of the zero crossing rate of the second signal for said first frame;

means for comparing said average of the magnitude of the second signal to said background noise magnitude threshold;

means for comparing said average of the zero crossing rate of the second signal to said background noise zero crossing rate threshold; and means for generating, upon said average of the magnitude or said zero crossing rate consecutively exceeding said background noise threshold a first predetermined number of frames, the first signal.

6. An apparatus for generating a first signal in accordance with claim 5 wherein said computing said background noise magnitude and zero crossing rate thresholds further comprises:

means for computing a standard deviation of the magnitude of the second signal for said second predetermined number of frames;

means for computing a standard deviation of the zero crossing rate of the second signal for said second predetermined number of frames;

means for multiplying said standard deviation of the magnitude by a second predetermined number and adding said average of the magnitude; and means for multiplying said standard deviation of the zero crossing rate by a third predetermined number and adding said average of the zero crossing rate.

7. An apparatus for generating a first signal in accordance with claim 5 wherein said second signal is a speech channel signal.

* * * * *